(12) United States Patent
Park et al.

(10) Patent No.: US 11,184,698 B2
(45) Date of Patent: Nov. 23, 2021

(54) HEADSET CAPABLE OF WIRELESS CHARGING, AND HEADSET CHARGING SYSTEM USING WIRELESS POWER TRANSMISSION COMPRISING SAME

(71) Applicant: AMOSENSE CO., LTD, Cheonan-si (KR)

(72) Inventors: Jun Ho Park, Seoul (KR); Jin Pyo Park, Seoul (KR); Cheol Seung Han, Seoul (KR)

(73) Assignee: Amosense Co., Ltd., Cheonan-si (KR)

( * ) Notice: Subject to any disclaimer, the term of this patent is extended or adjusted under 35 U.S.C. 154(b) by 300 days.

(21) Appl. No.: 16/471,688

(22) PCT Filed: Nov. 6, 2017

(86) PCT No.: PCT/KR2017/012489
§ 371 (c)(1),
(2) Date: Jun. 20, 2019

(87) PCT Pub. No.: WO2018/117404
PCT Pub. Date: Jun. 28, 2018

(65) Prior Publication Data
US 2020/0007971 A1 Jan. 2, 2020

(30) Foreign Application Priority Data

Dec. 21, 2016 (KR) .................. 10-2016-0175644

(51) Int. Cl.
*H04R 1/10* (2006.01)
*H01F 38/14* (2006.01)
*H01M 10/46* (2006.01)

(52) U.S. Cl.
CPC ........... *H04R 1/1025* (2013.01); *H01F 38/14* (2013.01); *H01M 10/46* (2013.01); *H04R 2205/021* (2013.01); *H04R 2420/07* (2013.01)

(58) Field of Classification Search
CPC .. H04R 1/1025; H04R 1/10; H04R 2205/021; H04R 2420/07; H04R 1/1008;
(Continued)

(56) References Cited

U.S. PATENT DOCUMENTS 8,310,201 B1 * 11/2012 Wright ................. H02J 7/0045
320/108
10,341,787 B2 * 7/2019 Blum ...................... H02J 50/27
(Continued)

FOREIGN PATENT DOCUMENTS

CN 204795531 U * 11/2015 ............... H04R 1/10
CN 109510267 A * 3/2019 ........... H02J 7/0045
(Continued)

OTHER PUBLICATIONS

Travis Deyle & Matthew Reynolds, 2008, PowerPack: A Wireless Power Distribution System for Wearable Devices, IEEE.org, pp. 91-96 (Year: 2008).*

*Primary Examiner* — M Baye Diao
(74) *Attorney, Agent, or Firm* — Rothwell, Figg, Ernst & Manbeck, P.C.

(57) ABSTRACT

A headset capable of wireless charging is provided. The headset capable of wireless charging according to one embodiment of the present invention comprises: a pair of body units including a housing equipped with a speaker and a cushion unit; a connecting unit configured to connect the pair of body units; a battery module embedded in at least one of the body units and connecting unit to provide driving power; and a wireless power receiving antenna configured to receive wireless power transmitted from the outside to supply power for charging the battery module.

9 Claims, 12 Drawing Sheets

(58) Field of Classification Search
CPC ......... H01F 38/14; H01F 27/36; Y02E 60/10; H02J 7/02; H05K 9/00; H01M 10/0585; H01M 10/46; H01M 50/216; H01M 50/209
USPC ........................................................ 320/108
See application file for complete search history.

(56) References Cited

U.S. PATENT DOCUMENTS

| | | | |
|---|---|---|---|
| 10,750,269 B2 * | 8/2020 | Lee | .................. H01M 10/0436 |
| 2010/0062731 A1 | 3/2010 | Ham et al. | |
| 2014/0270232 A1 | 9/2014 | Vroom et al. | |

FOREIGN PATENT DOCUMENTS

| | | | | |
|---|---|---|---|---|
| CN | 111065013 A | * | 4/2020 | ........... H04R 1/1016 |
| KR | 101542596 B1 | * | 8/2015 | ............... H04R 1/10 |
| KR | 20160029717 A | | 3/2016 | |
| KR | 101609950 B1 | * | 4/2016 | ............... H04R 1/10 |
| KR | 101620628 B1 | | 5/2016 | |
| KR | 20160129498 A | | 11/2016 | |
| KR | 101685413 B1 | | 12/2016 | |
| KR | 101718325 B1 | * | 3/2017 | ............... H04R 1/10 |
| WO | WO-2017086553 A1 | * | 5/2017 | ............... H04R 1/10 |

* cited by examiner

HEADSET CAPABLE OF WIRELESS CHARGING, AND HEADSET CHARGING SYSTEM USING WIRELESS POWER TRANSMISSION COMPRISING SAME

CROSS REFERENCE TO RELATED APPLICATION

This application is the national phase entry of International Application No. PCT/KR2017/012489, filed on Nov. 6, 2017, which is based upon and claims priority to Korean Patent Application 10-2016-0175644, filed on Dec. 21, 2016, the disclosures of which are incorporated herein by reference in their entireties.

TECHNICAL FIELD

The present invention relates to a headset capable of wireless charging and a headset charging system using wireless power transfer including the same.

BACKGROUND

Electronic goods, particularly electronic goods capable of playing sounds are becoming miniaturized with the development of technology. Such electronic goods are configured to be connected to various headsets. In particular, functions of sound-playing electronic goods such as MP3 players and the like are being combined in smartphones as smartphones are developed.

Further, as wireless communication technology is developed, users desire smartphones or sound-playing electronic goods (hereinafter, referred to as 'portable devices') that are easier to use. Accordingly, headsets such as earphones or headphones have been released as products in the form that connects to portable devices wirelessly in place of the conventional way that connects in a wired-connecting manner to portable devices.

A battery module is mounted in the headset to drive electronic components inside the headset. Since the above-described battery module has a limited capacity, it is inconvenient to frequently charge the battery module. Further, charging in a wired manner using a charging cable is used to charge the battery module of a conventional headset. Accordingly, since the conventional headset should include a separate charging port to charge a battery, an appealing design of an overall exterior can be difficult to realize. In addition, since the conventional headset has a shape in which the charging port is exposed to the outside, foreign substances, moisture, and the like may be introduced through the charging port.

SUMMARY OF THE INVENTION

The present invention is directed to providing a headset capable of easily charging power of a battery using a wireless power transfer manner and a headset charging system using wireless power transfer including the same.

Further, the present invention is directed to providing a headset capable of preventing an overall problem such as the introduction of foreign substances and moisture through a charging port since the charging port configured to charge a battery is unnecessary and a headset charging system using wireless power transfer including the same.

One aspect of the present invention provides a headset capable of wireless charging including: a pair of body units each including a housing equipped with a speaker and a cushion unit; a connecting unit configured to connect the pair of body units; a battery embedded in at least one of the body units and the connecting unit to provide driving power; and a wireless power receiving antenna configured to receive wireless power transmitted from the outside to supply power for charging the battery.

Further, the headset may include a shielding sheet disposed on one surface of the wireless power receiving antenna so that a magnetic field generated from the wireless power receiving antenna may be shielded to be collected in a predetermined direction.

As an example, the housing may include a winding portion formed to protrude to the outside, and the wireless power receiving antenna may be wound along a circumferential surface of the winding portion.

In this case, the winding portion may be formed at a position that does not overlap a metal portion of the speaker.

As another example, the wireless power receiving antenna may be wound along an inner surface of the housing. In this case, the wireless power receiving antenna may be embedded in the housing and disposed behind the speaker.

As another example, the wireless power receiving antenna may be embedded in the connecting unit, and the wireless power receiving antenna may be embedded in each of the body unit and the connecting unit.

Further, the battery embedded in the connecting unit may be a flexible battery.

In addition, the flexible battery may include an exterior material and an electrode assembly, the exterior material and the electrode assembly may include a pattern for contraction and relaxation in a longitudinal direction, and the pattern formed in the exterior material and the pattern formed in the electrode assembly may be formed to coincide with each other.

Meanwhile, another aspect of the present invention provides a headset charging system using wireless power transfer, including: the above-described headset capable of wireless charging; and a charging device including a wireless power transmitting antenna configured to provide wireless power to the headset to charge the battery when the headset is held.

Further, the charging device may include a holding member on which the headset is held, and a wireless power transmitting antenna embedded in the holding member to be located at a position corresponding to the wireless power receiving antenna.

In addition, the headset charging system may include a shielding sheet disposed on one surface of the wireless power transmitting antenna so that a magnetic field generated from the wireless power transmitting antenna may be shielded to be collected in a predetermined direction.

As an example, the holding member may include a base part and an accommodation part configured to protrude in both directions from the base part and having one end portion inserted into and disposed in a center portion of the cushion unit when the headset is held. In this case, the wireless power transmitting antenna may be embedded in an end portion of the accommodation part.

As another example, the holding member may include a base part, and a protruding part configured to protrude in both directions from the base part and in which a seating groove, into which the body unit is inserted when the headset is held, is formed. In this case, the wireless power transmitting antenna may be embedded in the protruding part.

As another example, the holding member may include a supporting part configured to support the middle portion of a length of the connecting unit. In this case, the wireless power transmitting antenna may be embedded in the supporting part.

According to the present invention, a battery included in a headset can be charged using a wireless manner in a state of being simply held on a charging device when not in use. Accordingly, since a headset and a headset charging system according to the present invention do not have to use a charging cable unlike a conventional case, user convenience can be improved.

Further, in the present invention, although a wireless power receiving antenna is installed at a position close to a speaker including a metal portion, desired charging efficiency can be satisfied without influence by metal.

In addition, since a charging port, which is an essential configuration configured to connect a charging cable in a conventional wired-charging manner, is not necessary in the present invention, a failure due to introduction of foreign substances and penetration of moisture through the charging port can be prevented.

DETAILED DESCRIPTION OF THE INVENTION

Figure 1:
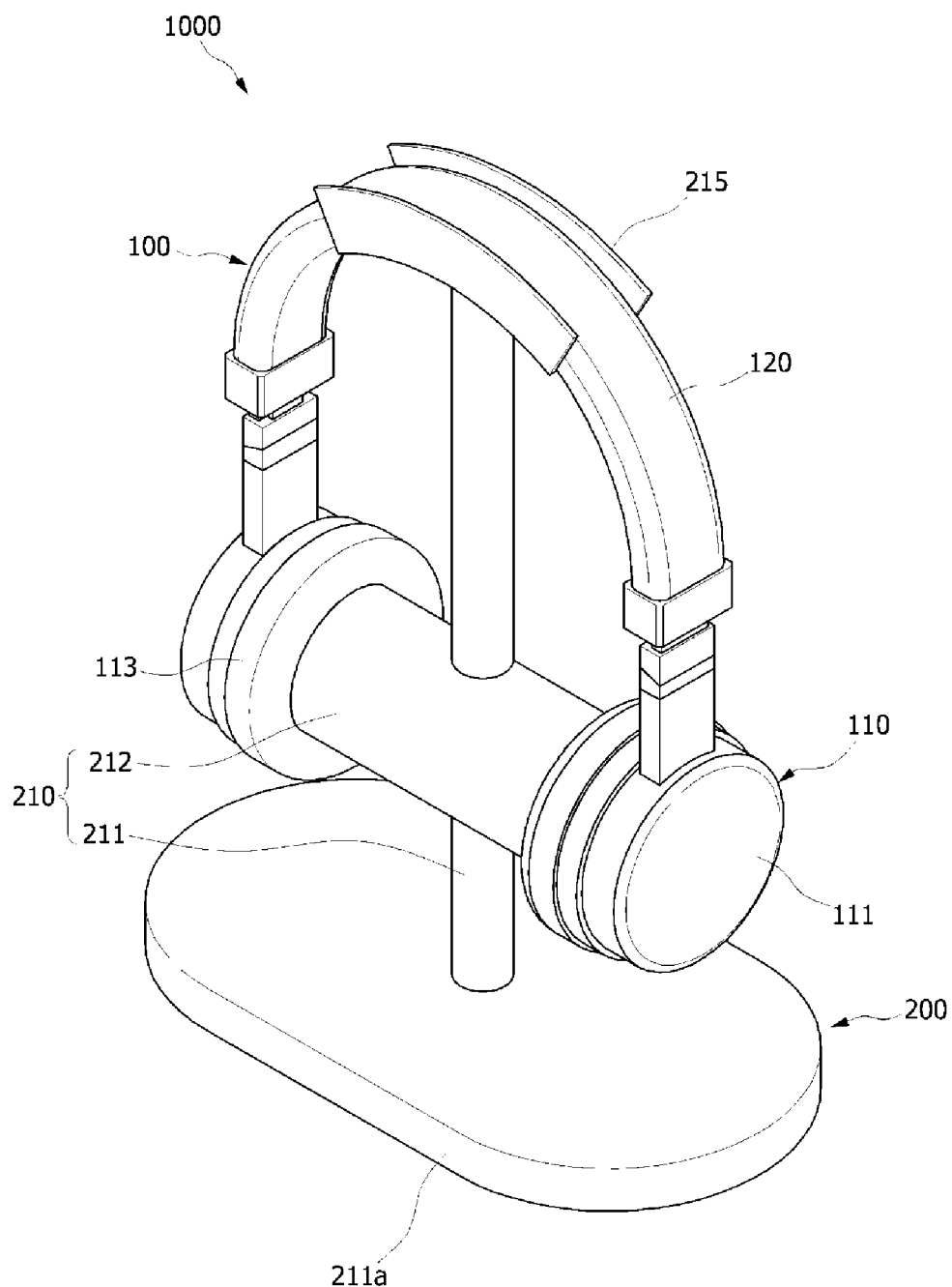
FIG. 1 is a view illustrating a headset charging system using wireless power transfer according to a first embodiment of the present invention.

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are not included in the drawings to clearly describe the present invention, and the same reference symbols are used for the same or similar components in the description.

Figure 2:
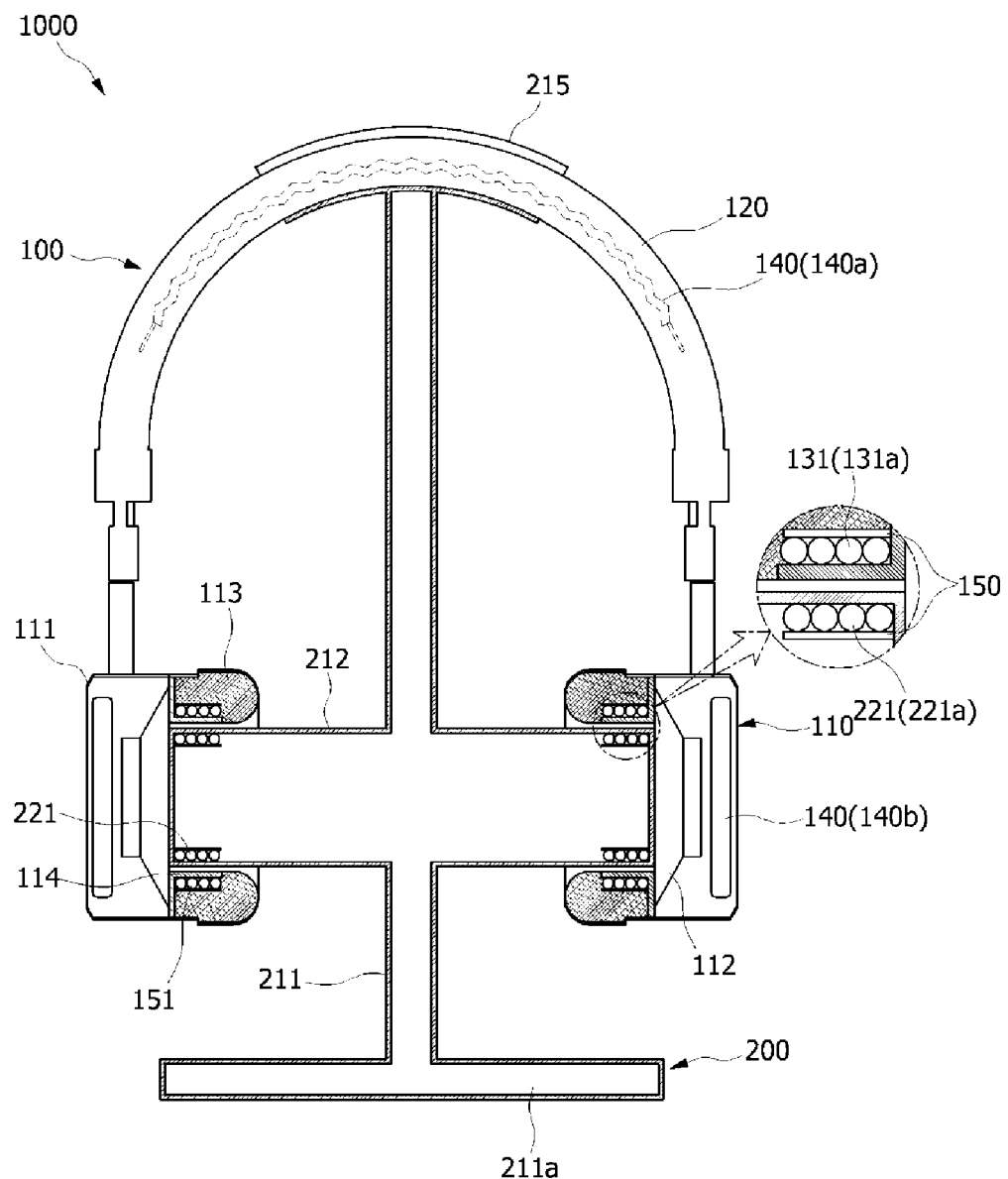
FIG. 2 is a view schematically illustrating an inner configuration in FIG. 1.

As shown in FIGS. 1 and 2, a headset 100 capable of wireless charging according to one embodiment of the present invention includes a pair of body units 110, a connecting unit 120, a battery module 140, and at least one wireless power receiving module 130.

Each of the pair of body units 110 may include a housing 111, a speaker 112 mounted in the housing 111, and a cushion unit 113 disposed around the speaker 112. When a user wears the headset 100 according to one embodiment of the present invention, the body units 110 may be located at the user's ears.

The housing 111 may have an inner space formed therein. A shape of the housing 111 may vary according to a manufacturer's design.

The speaker 112 outputs sounds to the outside. The above-described speaker 112 may be embedded in the housing 111 to face the user's ear when worn. In this case, the speaker 112 may be a known speaker included in a general headset, and detailed descriptions of the above will not be provided.

The cushion unit 113 may be formed of a material deformable by an external force, and may be provided at one side of the body unit 110 which comes into contact with a body when the headset is worn. The above-described cushion unit 113 may be formed of a soft material such as synthetic resin, leather, artificial leather, or the like, and may have a shape in which a cushion member such as sponge or the like is embedded. Accordingly, the user may comfortably wear the headset 100 through the cushion units 113.

The cushion unit 113 may have a shape in which a center portion is recessed so that the sounds output from the body units 110 may be smoothly transferred to the user's ears, and outside noises may be blocked.

The connecting unit 120 may connect the pair of body units 110, and may have a shape in which an entire length is variable to flexibly cope with the size or shape of the user's head when the headset is worn. Further, a cable or an electric pattern may be provided inside the connecting unit 120 to electrically connect the pair of body units 110.

The battery module 140 may provide power to electronic components included in the headset 100 capable of wireless charging according to one embodiment of the present invention. In this case, the battery module 140 may be embedded in at least one of the pair of body units 110 and the connecting unit 120.

As an example, the battery module 140 may be embedded only in the connecting unit 120, or may be embedded only in the body unit 110. Further, when the battery module 140 is embedded in the body unit 110, the battery module 140 may be embedded only in one body unit 110 of the pair of body units 110.

As another example, the battery module 140 may also be embedded in both the connecting unit 120 and the body units 110. Accordingly, since all power of the battery modules 140 embedded in the connecting unit 120 and the body units 110 may be used, an overall use time of the headset 100 may increase.

As an example, the battery module 140 may be a rechargeable secondary battery. A detailed configuration of the above-described battery module 140 will be described later.

The wireless power receiving module 130 may wirelessly receive power supplied from the outside to charge the power of the battery module 140. For this end, the wireless power receiving module 130 may include at least one wireless power receiving antenna 131, and the wireless power receiving antenna 131 may be embedded in at least one of the cushion unit 113 and the body unit 110.

In this case, a shielding sheet 150 may be disposed at one side of the wireless power receiving antenna 131. That is, the shielding sheet 150 may be disposed adjacent to the wireless power receiving antenna 131, and may shield a magnetic field generated from the wireless power receiving antenna 131 to collect the magnetic field in a predetermined direction.

The above-described shielding sheet 150 may have a plate-shaped sheet shape having a predetermined area. As an example, the shielding sheet 150 may be a ferrite sheet or an amorphous sheet, and may also be a hybrid sheet in which the above sheets are laminated.

Here, the ferrite sheet may be a sintered ferrite sheet, and may be formed of Mn—Zn ferrite or Ni—Zn ferrite. Further, the amorphous sheet may be a ribbon sheet including at least one of an amorphous alloy and a nano-crystal alloy, and may have a shape in which ribbon sheets are laminated in multilayers. In addition, the shielding sheet 150 may be flaked and divided into a plurality of fine pieces. However, the shielding sheet 150 is not limited thereto, and all known shielding sheets may be applied.

Meanwhile, the headset 100 may play music files embedded therein. Further, the headset 100 may output sound signals generated from an external device.

As an example, the headset 100 may be a wireless headphone wirelessly connected to the external device. That is, the headset 100 may include a separate communication part (not shown) to be wirelessly connected to the external device. As a specific example, the communication part may be connected to the external device in a Bluetooth manner Here, the external device may be a portable electronic device such as a smartphone, a tablet, or the like, and may also be a sound device such as a stationary audio.

The Bluetooth may transfer data without directivity and may process the sounds and the data simultaneously. Further, the Bluetooth may allow pairing to one device or multiple devices. In addition, the Bluetooth may exchange signals through a wall without limitation of a signal transmission angle.

However, a communication manner between the communication part and the external device is not limited thereto, and all known wireless communication manners may be applied.

As another example, the headset 100 may be connected to the external device through a stereo cable (not shown). Accordingly, the sound signals generated from the external device may be transmitted to the headset 100 through the stereo cable in a wired manner That is, when the battery module 140 is discharged and thus the headset 100 is not turned on, or the user want to enjoy music with better sound quality, the user may listen to music using the stereo cable.

Meanwhile, the headset 100 may further include a microphone (not shown). The microphone may be formed at one side of the body unit 110. The above-described microphone may receive a user's voice and then transmit the voice to the external device.

The above-described headset 100 according to one embodiment of the present invention may configure headset charging systems 1000, 2000, and 3000 using wireless power transfer together with a charging device 200 configured to wirelessly charge the power of the battery module 140.

That is, a headset charging system 1000 using wireless power transfer according to a first embodiment of the present invention may include the above-described headset 100 capable of wireless charging and the charging device 200.

The charging device 200 may supply wireless power to the headset 100 to charge the power of the battery module 140 when the headset 100 is located adjacent thereto.

As an example, when the headset 100 is held, since the charging device 200 may transmit the wireless power to the headset 100, the power of the battery module 140 may be charged. For this end, the charging device 200 may include a holding member 210 and a wireless power transmitting module 220.

The holding member 210 may be provided so that the headset 100 may be held thereon. Various shapes of the holding member 210 for the above will be described later.

The wireless power transmitting module 220 may be embedded in a part of the holding member 210, and may transmit power to the wireless power receiving module 130 embedded in the headset 100.

For this end, the wireless power transmitting module 220 may include a wireless power transmitting antenna 221 configured to transmit power to the wireless power receiving antenna 131 embedded in the headset 100. Further, a shielding sheet 150 configured to shield a magnetic field generated in a predetermined frequency band to collect the magnetic field in a predetermined direction may be disposed on one surface of the wireless power transmitting antenna 221. In addition, the charging device 200 may include a power cable 224 and a power plug 225 configured to receive power from the outside.

Accordingly, the power supplied to the wireless power transmitting module 220 from the outside may be transmitted to the wireless power receiving module 130 through the wireless power transmitting module 220 in a state of being converted to wireless power.

Meanwhile, in the headset charging system 1000 using wireless power transfer according to the first embodiment of the present invention, as shown in FIG. 2, the headset 100 capable of wireless charging may include a winding portion 114.

The above-described winding portion 114 may protrude toward the cushion unit 113 from the housing 111 on a boundary portion with the cushion unit 113. As an example, the winding portion 114 may have a ring shape. In this case, the wireless power receiving antenna 131a may have a shape in which a conductive member having a predetermined line diameter is wound in a coil shape along a circumferential direction of the winding portion 114.

Further, the winding portion 114 may be formed to located at inner side of a ring-shaped metal frame 112a configured to maintain a shape of a diaphragm (not shown) in the speaker 112, and when the speaker 112 includes a permanent magnet 112b, the winding portion 114 may be formed to be located between the permanent magnet 112b and the metal frame 112a to prevent loss of the magnetic field generated from the wireless power receiving antenna 131a due to influence of the metal frame 112a when the wireless power is received.

Meanwhile, as shown in FIGS. 1 and 2, the charging device 200 configured to transmit the wireless power to charge the power of the battery module 140 embedded in the headset 100 may include a base part 211 and an accommodation part 212 as an aspect.

The base part 211 may be formed to have a predetermined height. For example, the base part 211 may be formed in a vertical direction. The charging device 200 may be located on ground or a table. In this case, a lower portion 211a of the base part 211 may have a flat shape to be stably located on the ground or the table.

In this case, the accommodation part 212 may have a shape protruding in both directions from a part of the base part 211, and the wireless power transmitting antenna 221a may be embedded in an end portion of the accommodation part 212.

As an example, the accommodation part 212 may have a cylindrical shape. Accordingly, when the headset 100 is held on the holding member 210, one end portion of the accommodation part 212 may be inserted into and disposed in a center portion of the cushion unit 113.

Here, when the end portion of the accommodation part 212 is inserted into the cushion unit 113, the wireless power transmitting antenna 221a may be embedded in the accommodation part 212 so that the wireless power transmitting antenna 221a may be disposed at a position corresponding to the wireless power receiving antenna 131a wound around the winding portion 114.

Meanwhile, when the headset 100 is held on the holding member 210, the winding portion 114 may be located adjacent to the end portion of the accommodation part 212 inserted into and disposed in the center portion of the cushion unit 113. Accordingly, since the wireless power receiving antenna 131a and the wireless power transmitting antenna 221a may be maximally adjacent to each other, the wireless power may be stably transmitted.

Here, the number of winding and the shape of each of the above-described wireless power transmitting antenna 221a and wireless power receiving antenna 131a may be appropriately changed according to a design condition.

In the above-described headset charging system 1000 using wireless power transfer, charging may proceed when the headset 100 is held on the charging device 200. That is, when the user does not use the headset 100, the battery module 140 may be wirelessly charged in a case in which the headset 100 is held on the holding member 210. Accordingly, in the headset charging system 1000 using wireless power transfer according to the first embodiment of the present invention, unlike a conventional method, the headset 100 may be charged without connecting a charging cable to the body unit 110, and thus user convenience may be improved.

Further, in the headset 100 applied to the headset charging system 1000 using wireless power transfer according to the first embodiment of the present invention, since a charging port which is an essential configuration configured to connect a charging cable in a conventional wired charging manner is not necessary, introduction of foreign substances and penetration of moisture through the charging port may be prevented. Accordingly, a failure due to the foreign substances and the moisture may be prevented. Accordingly, the user may very easily handle and manage the headset charging system 1000 using wireless power transfer.

Further, since the headset charging system 1000 using wireless power transfer according to the first embodiment of the present invention does not include a charging port where the inside of the body unit 110 may be exposed to the outside, airtightness may be improved and thus a structure for waterproofing can be easily implemented.

In addition, in the headset charging system 1000 using wireless power transfer according to the first embodiment of the present invention, since a space is additional used as much as the charging port occupies, a degree of design freedom may be improved by adding additional functions or by making innovative design changes.

Figure 3:
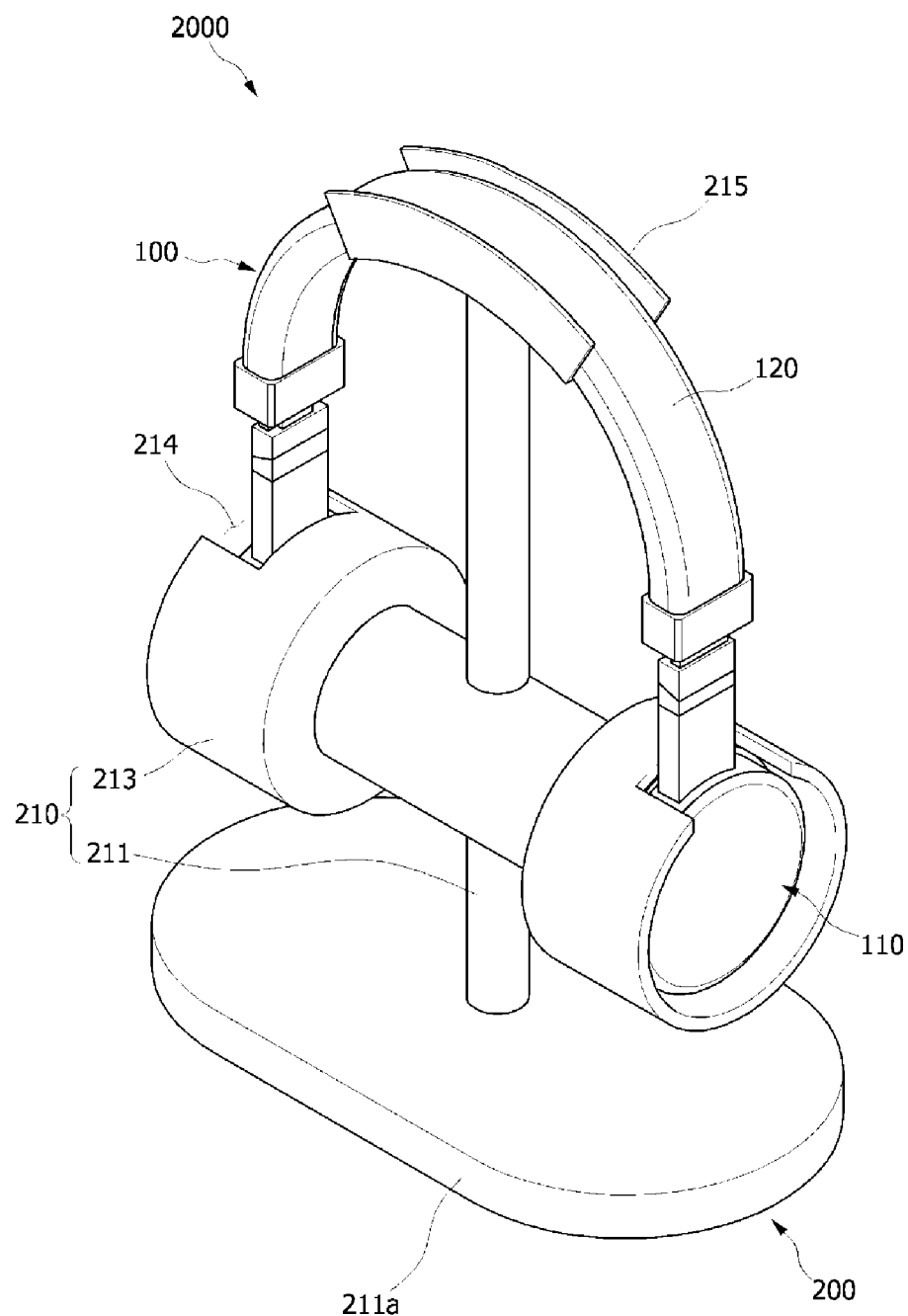
FIG. 3 is a view illustrating a headset charging system using wireless power transfer according to a second embodiment of the present invention.
Figure 4:
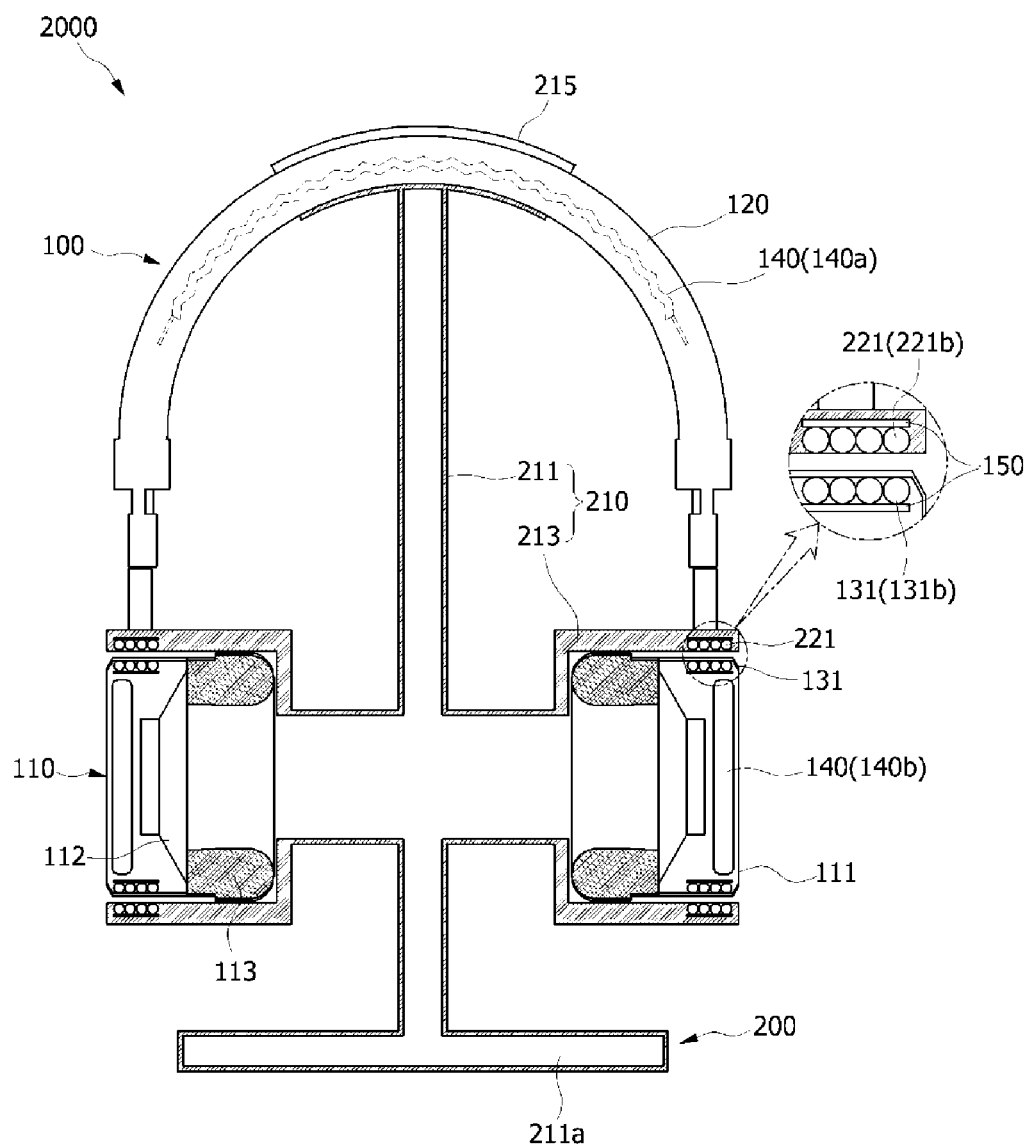
FIG. 4 is a view schematically illustrating an inner configuration in FIG. 3.

Meanwhile, as shown in FIGS. 3 and 4, a wireless power receiving antenna 131b included in a headset 100 capable of wireless charging may be embedded to be adjacent to a circumferential surface of the body unit 110 in a headset charging system 2000 using wireless power transfer according to a second embodiment of the present invention. That is, in this embodiment, the wireless power receiving antenna 131b may be located behind a speaker 112 unlike the above-described embodiment.

In this embodiment, a charging device 200 configured to charge the power of a battery module 140 embedded in the headset 100 may include a holding member 210 configured to hold the headset 100, and the holding member 210 may include a base part 211 and a protruding part 213.

Since the base part 211 is identical to the base part 211 (see FIG. 1) of the charging device 200 (see FIG. 1) of the above-described embodiment, descriptions of the above will not be provided.

The protruding part 213 may be formed to protrude from a part of the base part 211 in both directions. In this case, a seating groove 214 into which the body unit 110 of the headset 100 may be inserted may be formed in an end portion of the protruding part 213. The seating groove 214 may have a size greater than or similar to that of the body unit 110.

Here, a wireless power transmitting antenna 221b included in the charging device 200 may be embedded in the end portion of the protruding part 213. Accordingly, when the body unit 110 is inserted into and disposed in the seating groove 214, the wireless power transmitting antenna 221b may be disposed at a position corresponding to the wireless power receiving antenna 131b embedded to be adjacent to a circumferential surface of the body unit 110.

Accordingly, when the user inserts the body unit 110 of the headset 100 into the seating groove 214 of the charging device 200, the wireless power receiving antenna 131b and the wireless power transmitting antenna 221b may be located at positions corresponding to each other, and the power of the battery module 140 embedded in the headset 100 may be charged using wireless power transmitted from the wireless power transmitting antenna 221b.

In the above-described headset charging system 2000 using wireless power transfer according to the second embodiment of the present invention, the body unit 110 may be charged in a state of being accommodated in the seating groove 214 in comparison with the headset charging system 1000 using wireless power transfer (see FIG. 1) according to the above-described embodiment. Accordingly, the power of the battery module 140 may be charged in a state in which the cushion unit 113 is protected from the outside by the protruding part 213.

Further, when lighting units are provided on an outer surface of the protruding part 213, an appearance of the headset charging system 2000 using wireless power transfer according to the second embodiment of the present invention may become beautiful due to light emission of the lighting units.

As described above, in the headset charging systems 1000 and 2000 using wireless power transfer according to the first and second embodiments of the present invention, the wireless power receiving antennas 131a and 131b configured to receive the wireless power transmitted from the charging device 200 may be embedded in the housing 111 to be disposed along a circumferential surface of the winding portion 114 or located behind the speaker 112. Accordingly, in the headset charging systems 1000 and 2000 using wireless power transfer according to the first and second embodiments of the present invention, since influence of the metal portion included in the speaker 112 is minimized or structurally prevented, wireless charging may be smoothly performed even when the wireless power receiving antennas 131a and 131b are disposed at positions close to the speaker 112.

Figure 13:
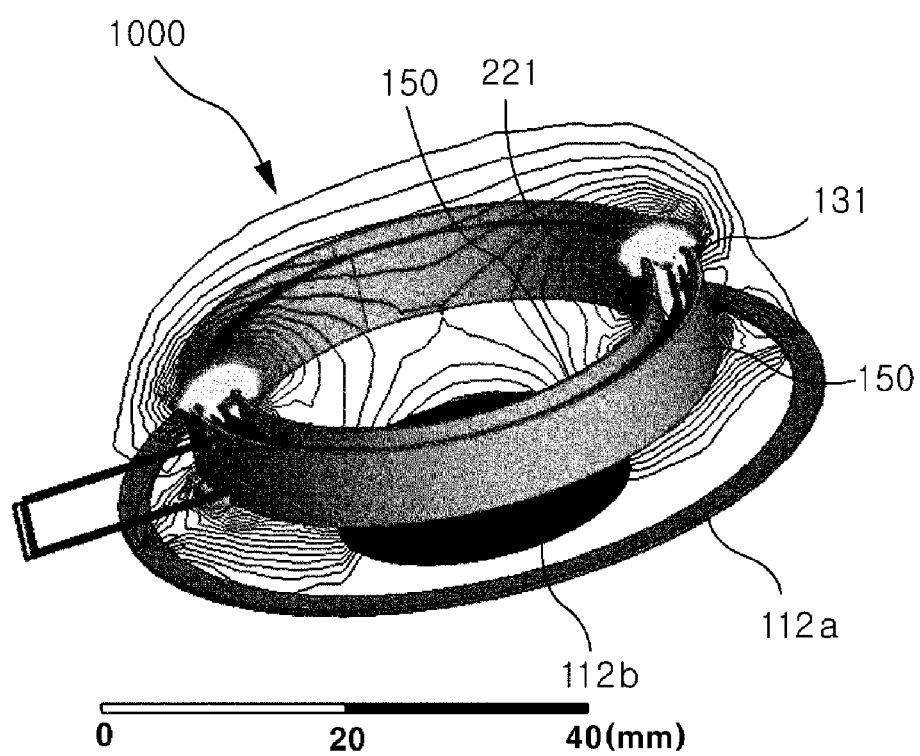
FIGS. 13 and 14 are views illustrating magnetic field distribution in the headset charging system using wireless power transfer according to the present invention.
Figure 14:
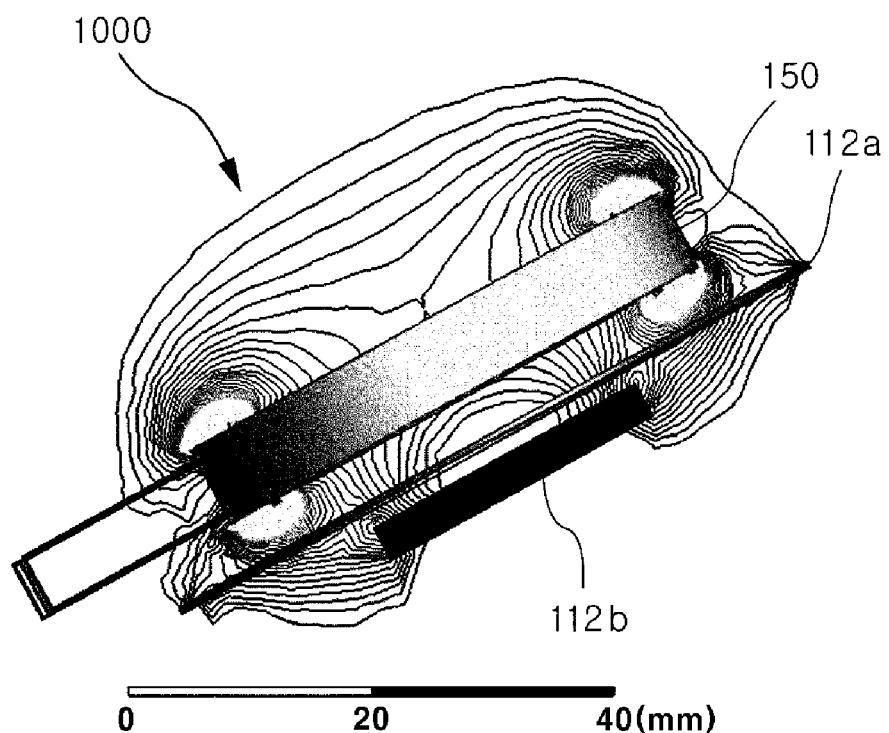
Figure 15:
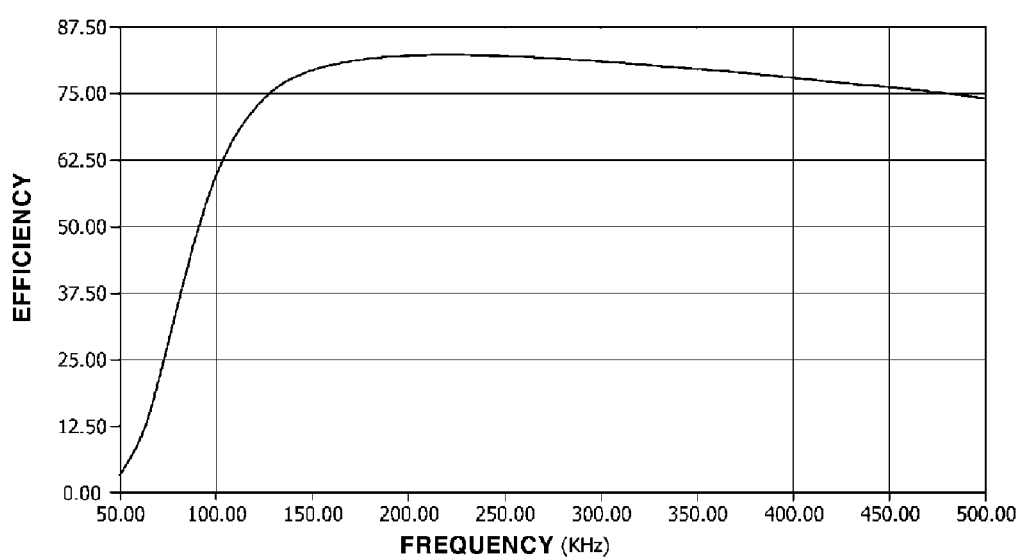
FIG. 15 is a graph illustrating charging efficiency according to a frequency in the headset charging system using wireless power transfer according to the present invention.

The above may be confirmed through FIGS. 13 to 15.

That is, FIGS. 13 and 14 are views illustrating distribution of a magnetic field, generated from the wireless power receiving antenna 131 and the wireless power transmitting antenna 221 when the wireless power is transmitted, in the headset charging systems 1000 and 2000 using wireless power transfer shown in FIGS. 1 to 4, and FIG. 15 is a graph illustrating charging efficiency according to a frequency.

Here, the speaker 112 may include a ring-shaped metal frame 112a and a permanent magnet 112b to maintain the shape of a diaphragm (not shown). As shown in simulation results, when structures in the above-described first and second embodiment are used, it can be confirmed that the magnetic field generated between the wireless power receiving antenna 131 and the wireless power transmitting antenna 221 is almost not lost by the permanent magnet 112b and the metal frame 112a included in the speaker 112.

Further, as shown in FIG. 15, in the headset charging system using wireless power transfer according to the present invention, it can be confirmed that maintain charging efficiency of 62.5% or more is maintained in a frequency band in which the wireless charging occurs, as an example, a band of 100 to 350 kHz, and particularly, it can be confirmed that charging efficiency of 75% or more is maintained in a band of 125 to 350 kHz. In FIG. 15, an x-axis indicates an operation frequency, and a y-axis indicates the charging efficiency.

As described above, the headset charging system using wireless power transfer according to the present invention may satisfy generally desired wireless charging efficiency of 70% or more without influence by the speaker 112 even when the wireless power receiving antenna 131 is disposed at a position close to the speaker 112.

Figure 5:
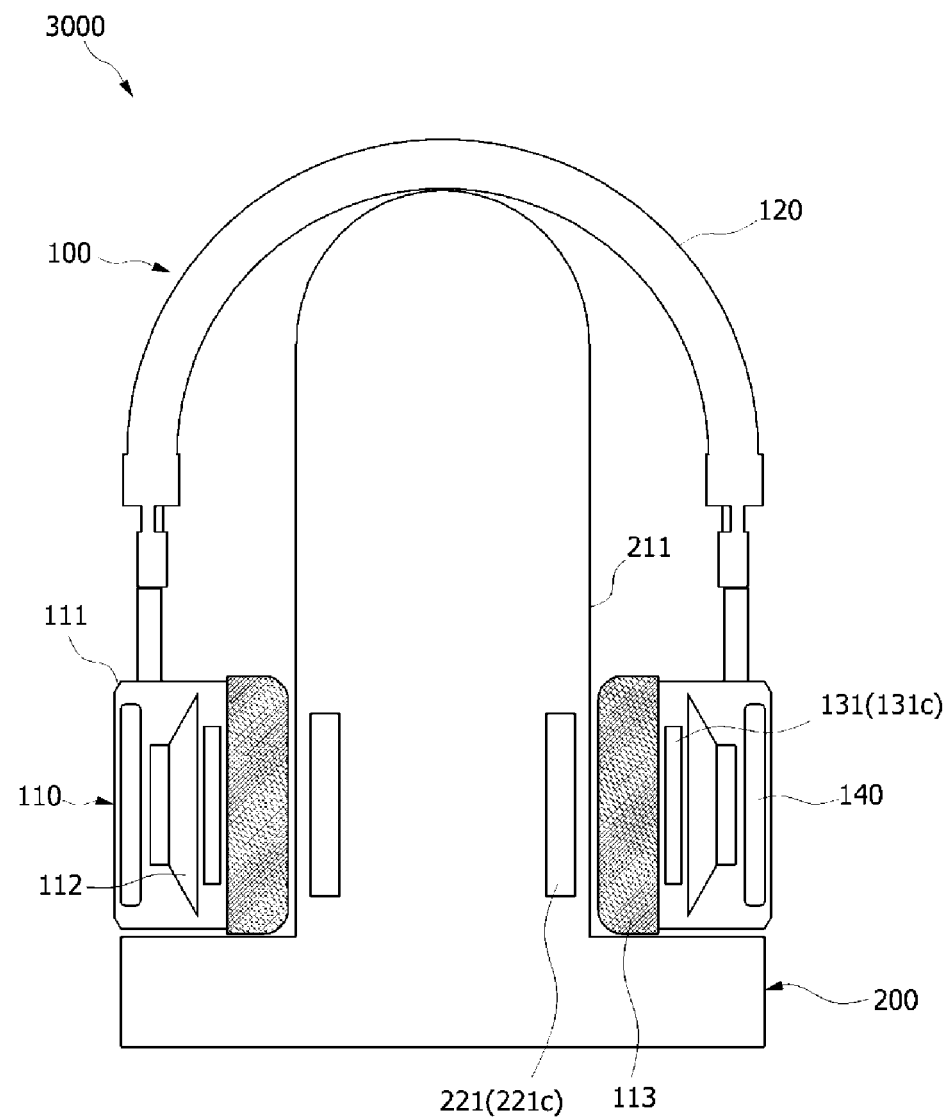
FIG. 5 is a view illustrating a headset charging system using wireless power transfer according to a third embodiment of the present invention.
Figure 6:
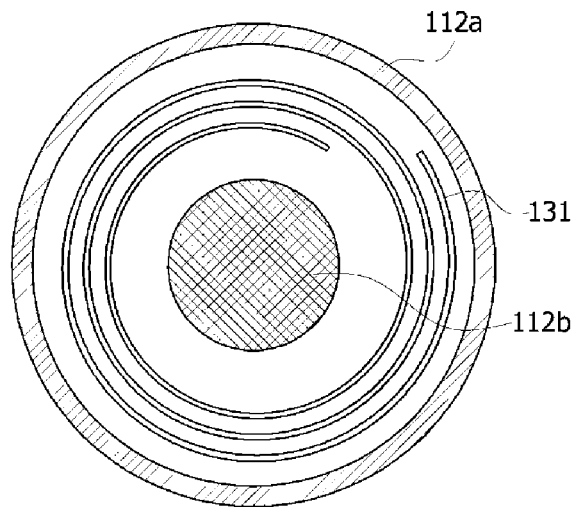
FIG. 6 is a view schematically illustrating an arrangement relationship between a wireless power receiving antenna and a speaker in a headset charging system using wireless power transfer according to the present invention.

Meanwhile, as shown in FIG. 5, a headset charging system 3000 using wireless power transfer according to a third embodiment of the present invention may include a headset 100 capable of wireless charging and a charging device 200, and a wireless power receiving antenna 131c included in the headset 100 capable of wireless charging may be located inside the housing 111, and may also be located between the speaker 112 and the cushion unit 113.

In this embodiment, a holding member 210 configuring the charging device 200 may include a base part 211.

As an example, the base part 211 may be formed to have a predetermined height, and a wireless power transmitting antenna 221c may be embedded in the base part 211. Here, the wireless power transmitting antenna 221c may be embedded in a part of the base part 211 to be disposed at a position corresponding to the wireless power receiving antenna 131c when the headset 100 is held on the holding member 210.

Even in this case, like the above-described embodiment, the wireless power receiving antenna 131c may be disposed to be located at an inner side of the metal frame 112a configuring the speaker 112 to minimize or prevent the influence from the metal portion of the speaker 112. Further, when the speaker 112 includes the permanent magnet 112b, the wireless power receiving antenna 131c may be disposed to be located between the permanent magnet 112b and the metal frame 112a. Accordingly, the wireless charging may be smoothly performed even when the wireless power receiving antenna 131c is disposed at a position close to the speaker 112.

In the headset charging system 3000 using wireless power transfer according to the third embodiment of the present invention, the charging device 200 may be formed in a simpler structure in comparison with the above-described headset charging systems 1000 and 2000 using wireless power transfer. Accordingly, the headset charging system 3000 using wireless power transfer according to the third embodiment of the present invention may be more easily manufactured.

Figure 7:
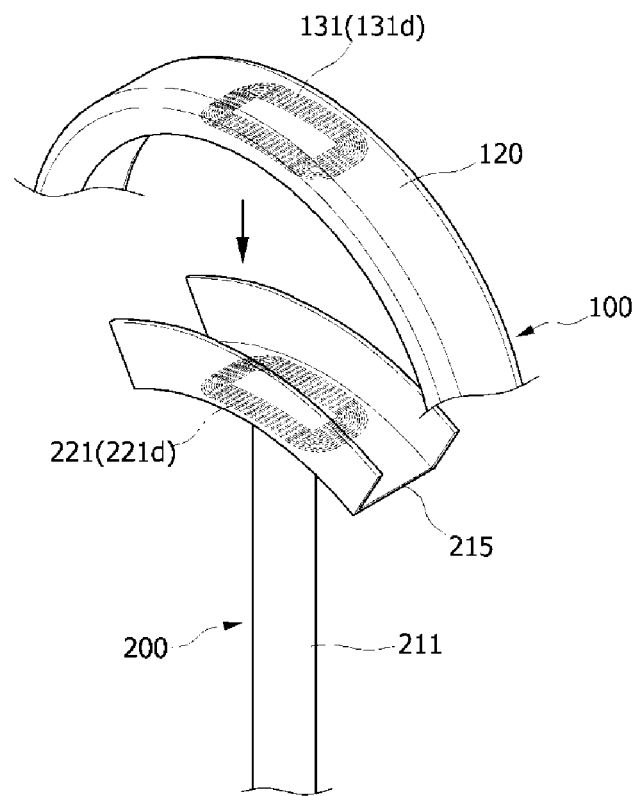
FIG. 7 is a view illustrating by extracting a connecting unit of a headset and a supporting part of a charging device applicable to the headset charging system using wireless power transfer according to the present invention.

Meanwhile, as shown in FIG. 7, each of the headset charging systems 1000 and 2000 using wireless power transfer according to the present invention may have a shape in which a wireless power receiving antenna 131d is embedded in the connecting unit 120 of the headset 100 and a wireless power transmitting antenna 221d is disposed at a supporting part 215 of the holding member 210 configuring the charging device 200.

That is, the holding member 210 shown in FIGS. 1 to 4 may include the supporting part 215 formed on upper portion of the base part 211. The supporting part 215 may support the connecting unit 120 of the headset 100 when the headset 100 is held on the charging device 200.

Here, a cross-sectional shape of the supporting part 215 may be a shape corresponding to a cross-section of the connecting unit 120, and may be variously changed according to a shape of the connecting unit 120.

In this case, the wireless power transmitting antenna 221d may be embedded in the supporting part 215 to be disposed at a position corresponding to the wireless power receiving antenna 131d embedded in the connecting unit 120 in a state in which the supporting part 215 supports the connecting unit 120 and thus the headset 100 is held on the charging device 200.

Further, although not shown in the drawings, the wireless power receiving antenna 131 may be embedded in each of the body unit 110 and the connecting unit 120, and may have a shape in which the wireless power transmitting antennas 221 corresponding to the wireless power receiving antenna 131 is embedded in the body unit 110 and the supporting part 215, respectively. In this case, one of two wireless power transfer antennas corresponding to each other may selectively operate, or both wireless power transfer antennas may simultaneously operate to reduce a charging time of the battery module 140.

Figure 8:
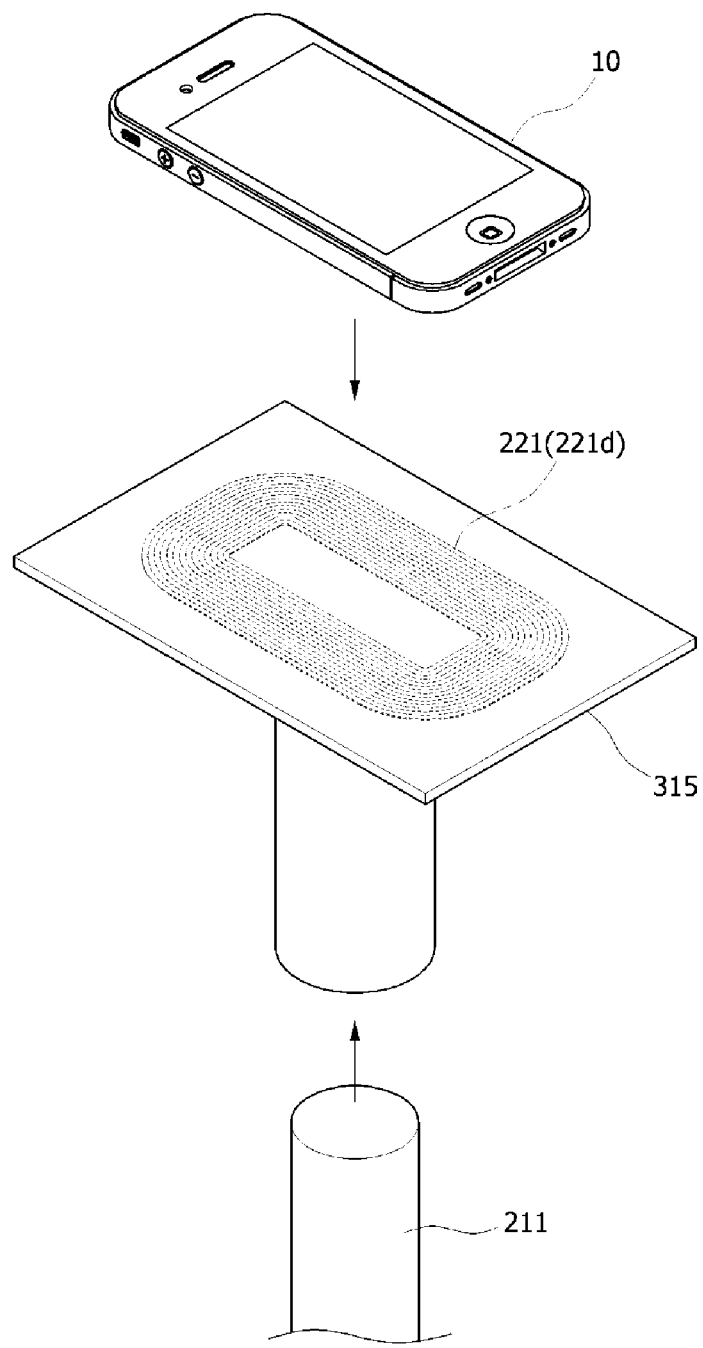
FIG. 8 is a view illustrating a modified example of the supporting part in FIG. 7.

Meanwhile, as shown in FIG. 8, the above-described supporting part may be detachably coupled to the base part 211.

Here, for an engaging structure between the supporting part 315 and the base part 211, all general structures used to detachably couple two members may be employed.

In this case, the supporting part 315 may have a shape on which a general electronic device 10 such as a mobile phone may be seated. As an example, the supporting part 315 may have a plate shape in which an upper side includes a horizontal surface. Accordingly, the wirelessly chargeable electronic device 10 may be placed on the horizontal surface of the supporting part 315.

However, the shape of the supporting part 315 is not limited thereto, and may be a shape corresponding to the shape of the electronic device 10 so that the electronic device 10 may be stably placed thereon. Accordingly, the charging device 200 may be used as a general-purpose wireless charging device capable of charging not only the above-described headset 100 but also the wirelessly chargeable general electronic device 10.

Figure 9:
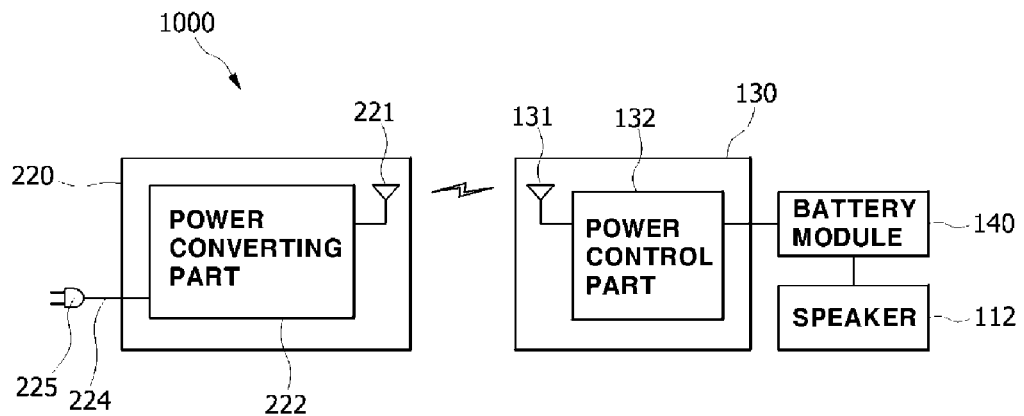
FIG. 9 is a block diagram illustrating the headset charging system using wireless power transfer according to the present invention.

Meanwhile, as shown in FIG. 9, the wireless power transmitting module 220 applied to the present invention may further include a power converting part 222. The power converting part 222 may convert power input from the outside into a form that can be transmitted from the wireless power transmitting antenna 221. The power cable 224 and the power plug 225 may be electrically connected to the power converting part 222.

Further, the wireless power receiving module 130 may further include a power control part 132. The power control part 132 may convert the wireless power received by the wireless power receiving antenna 131 into power capable of charging the battery module 140 embedded in the headset 100. Further, the power control part 132 may control charging of the battery module 140 to prevent overcharge of the battery module 140. For this end, the power control part may further include a protective circuit to prevent the overcharge of the battery module 140 when the battery module 140 is being charged.

A magnetic resonance manner or a magnetic induction manner which is known may be applied as a wireless power transfer manner applied to the present invention, but the present invention is not limited thereto, and all manners in which wireless power may be transmitted and received may be applied.

Meanwhile, the battery module 140 applied to the present invention may be a prismatic battery, a coin battery, or the like which is known, and may also be a plate-shaped flexible battery 140.

Particularly, when the battery module 140 is embedded in the connecting unit 130 (see FIGS. 2 and 4), the battery module 140 may be a flexible battery. That is, the flexible battery 140 may be freely curved according to deformation of the connecting unit 120 even when the connecting unit 120 is bent or curved while being used.

Accordingly, the flexible battery 140 may prevent degradation of a performance as a battery even when the connecting unit 120 is repeatedly bent while being used. Further, when the connecting unit 120 is formed in a shape having a predetermined curvature, the degradation of the performance of the battery may be prevented even when the flexible battery 140 is embedded in the connecting unit 120 in a state of being bent at the same or similar curvature as the connecting unit 120.

Figure 10:
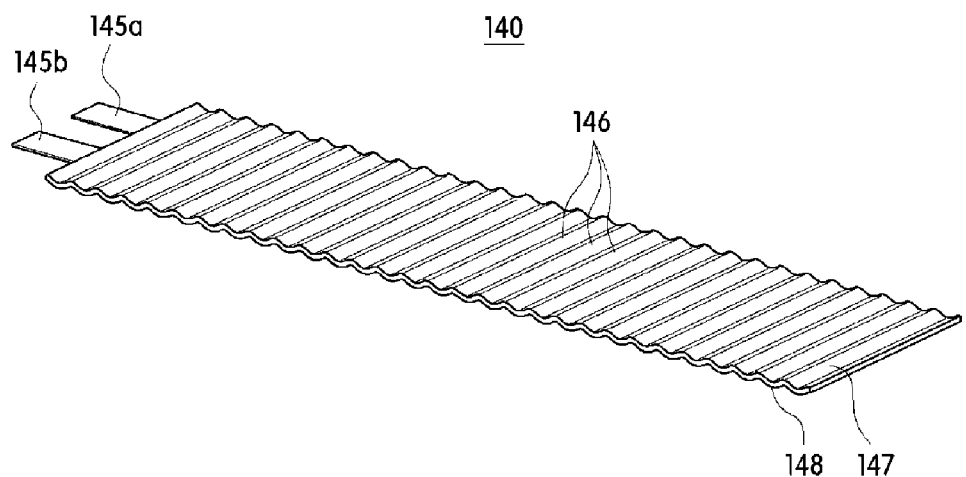
FIG. 10 is a schematic view illustrating a flexible battery applicable to a wirelessly chargeable headset according to the present invention.
Figure 11:
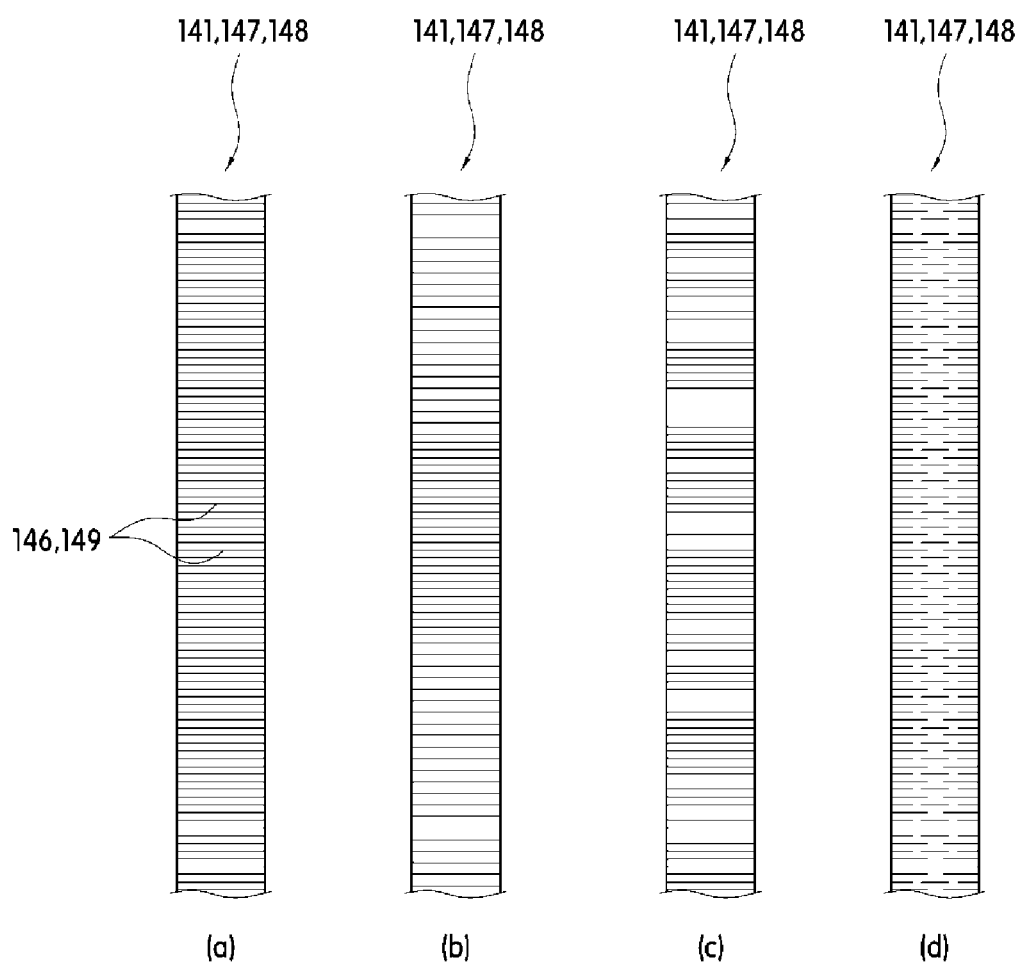
FIG. 11 is a view illustrating various patterns applicable to an electrode assembly and an exterior material in FIG. 10.
Figure 12:
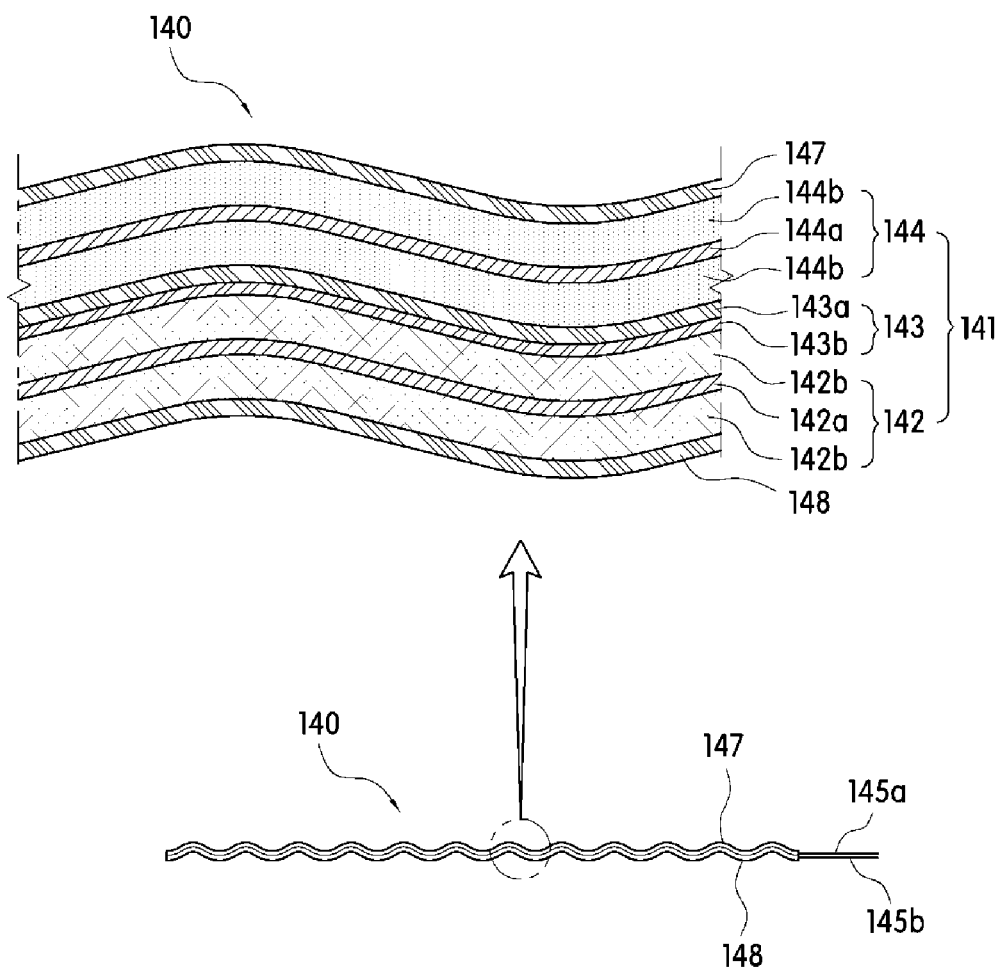
FIG. 12 is an enlarged cross-sectional view illustrating detailed configurations in FIG. 10.

As an example, as shown in FIGS. 10 to 12, the flexible battery 140 may include an electrode assembly 141 and exterior materials 147 and 148, and the electrode assembly 141 may be encapsulated with an electrolyte inside the exterior materials 147 and 148.

In this case, the electrode assembly 141 and the exterior materials 147 and 148 may include patterns 146 and 149 for contraction and relaxation in longitudinal directions thereof, respectively, and a first pattern 149 formed in the exterior materials 147 and 148 and a second pattern 146 formed in the electrode assembly 141 may be provided to have the same directivity.

Accordingly, since a deformation amount of base materials configuring the electrode assembly 141 and the exterior materials 147 and 148 is minimized even when the flexible battery 140 is embedded while being bent or curved at a predetermined curvature, damage or performance degradation of the electrode assembly 141 and the exterior materials 147 and 148 may be prevented.

In this case, the first pattern 149 and the second pattern 146 not only have the same directivity but also may be disposed to coincide with each other such that the first pattern 149 and the second pattern 146 have the same behavior.

As described above, in the flexible battery 140 applicable to the present invention, since the patterns 146 and 149 for contraction and relaxation in the longitudinal direction are formed in the electrode assembly 141 and the exterior materials 147 and 148 to coincide with each other, the electrode assembly 141 and the exterior materials 147 and 148 may always maintain a uniform interval or a contact state with respect to an entire length of the flexible battery 140 even when bending or the like in the longitudinal direction occurs. Accordingly, since the electrolyte encapsulated with the electrode assembly 141 may be uniformly distributed on the basis of the entire length of the flexible battery 140, the degradation of the performance as the battery may be prevented.

As an example, mountain portions and valley portions of each of the first pattern 149 and the second pattern 146 may be formed along width directions of the exterior materials 147 and 148 and the electrode assembly 141, and the mountain portions and the valley portions may be alternatively disposed along the longitudinal directions of the exterior materials 147 and 148 and electrode assembly 141. Further, in the mountain portions and the valley portions configuring the first pattern 149 and the second pattern 146, since the mountain portions are formed at the same position among themselves and the valley portions are formed at the same position among themselves, the first pattern 149 and the second pattern 146 may coincide with each other.

As a specific example, the mountain portions and the valley portions of the first pattern 149 and second pattern 146 may be formed in a direction parallel to a straight line parallel to the width directions of the exterior materials 147 and 148 and the electrode assembly 141, and the mountain portions and the valley portions may be repeatedly disposed along the longitudinal directions of the exterior materials 147 and 148 and electrode assembly 141.

In this case, the patterns 146 and 149 may be either continuously or discontinuously formed in the direction parallel to the width directions of the exterior materials 147 and 148 and the electrode assembly 141, may be formed on the basis of entire lengths of the electrode assembly 141 and the exterior materials 147 and 148, or may be partially formed on the basis of partial lengths of the electrode assembly 141 and the exterior materials 147 and 148.

Here, the mountain portions and the valley portions may be provided to have one cross-section among an arc-shaped cross-section including a semi-circle, a polygonal cross-section including a triangular or square cross-section, and a cross-section in which the arc-shaped cross-section and the polygonal cross-section are combined, and each of the mountain portions and the valley portions may be provided to have the same pitch and width, but may be provided to have different pitches and widths.

Accordingly, fatigue applied to the base materials through the patterns 146 and 149 may be reduced even when the exterior materials 147 and 148 and the electrode assembly 141 are embedded in the connecting unit 120 in a curved state.

Meanwhile, in the first pattern 149 and the second pattern 146, intervals between the mountain portions which are adjacent to each other or between the valley portion which are adjacent to each other may be formed to have the same interval, may be provided to have different intervals, or may be provided in a shape in which the same interval and the different intervals are combined.

Further, the first pattern 149 formed in the exterior materials 147 and 148 may be formed in entire surfaces of the exterior materials 147 and 148 but may also be partially formed.

The electrode assembly 141 is encapsulated with the electrolyte inside the exterior materials 147 and 148, and includes a positive electrode 142, a negative electrode 144, and a separator 143.

The positive electrode 142 may include a positive electrode current collector 142a and a positive electrode active material 142b, and the negative electrode 144 may include a negative electrode current collector 144a and a negative electrode active material 144b. Further, each of the positive electrode current collector 142a and the negative electrode current collector 144a may be implemented in a plate-shaped sheet shape having a predetermined area.

In this case, the positive electrode 142 and the negative electrode 144 may have shapes in which the active materials 142b and 144b are compressed, deposited, or coated on one surface or both surfaces of each of the current collectors 142a and 144a. Further, the active materials 142b and 144b may be provided on the basis of entire areas of the current collectors 142a and 144a, or may be partially provided on the basis of some areas.

In addition, the electrode assembly 141 may include a negative electrode terminal 145a and a positive electrode terminal 145b for electric connection to an external apparatus. Here, the positive electrode terminal 145b and the negative electrode terminal 145a may be provided in a shape which extends from the positive electrode current collector 142a and the negative electrode current collector 144a, respectively, to protrude from one sides of the exterior materials 147 and 148, and may also be provided to be exposed on the surfaces of the exterior materials 147 and 148.

In this case, the positive electrode active material 142b and the negative electrode active material 144b may contain polytetrafluoroethylene (PTFE). This is to prevent the positive electrode active material 142b and the negative electrode active material 144b from being peeled from the respective current collectors 142a and 144a or to prevent an occurrence of cracks when bent.

Meanwhile, the separator 143 disposed between the positive electrode 142 and the negative electrode 144 may include a nanofiber web layer 143b on one surface or both surfaces of a nonwoven fabric layer 143a.

Here, the nanofiber web layer 143b may be a nanofiber which contains at least one selected from the group including a polyacrylonitrile nanofiber and a polyvinylidene fluoride nanofiber.

Preferably, the nanofiber web layer 143b may include only the polyacrylonitrile nanofiber to secure radioactivity and uniform porosity.

Each of the exterior materials 147 and 148 may be a plate-shaped member having a predetermined area. The above-described exterior materials 147 and 148 may accommodate the electrode assembly 141 and the electrolyte therein to protect the electrode assembly 141 from the external force.

For this end, the exterior materials 147 and 148 may include a pair of first exterior material 147 and second exterior material 148, and since edges of the pair of first exterior material 147 and second exterior material 148 are enclosed by an adhesive, the electrolyte and the electrode assembly 141 accommodated in the exterior materials 147 and 148 may be prevented from exposure and leakage to the outside.

In the exterior materials 147 and 148, the first exterior material 147 and the second exterior material 148 may be formed of two members, and then all the edges configuring an enclosing part may be enclosed by an adhesive, or the first exterior material 147 and the second exterior material 148 may be formed of one members, and folded in half along the width direction or longitudinal direction and then the remaining portion abutting against each other may be enclosed by an adhesive.

Although one embodiment of the present invention is described above, the spirit of the present invention is not limited to one embodiment shown in the description, and although those skilled in the art may provide other embodiments through the addition, change, or removal of the components within the scope of the same spirit of the present invention, such embodiments are also included in the scope of the spirit of the present invention.

The invention claimed is:

1. A headset capable of wireless charging, comprising:
a pair of body units each including a housing equipped with a speaker and a cushion unit;
a connecting unit configured to connect the pair of body units;
a battery module embedded in at least one of the body units and the connecting unit to provide driving power; and
a wireless power receiving antenna configured to receive wireless power transmitted from the outside to supply power for charging the battery module,
wherein the housing includes a ring-shaped winding portion formed to protrude to the cushion unit; and
the wireless power receiving antenna is wound along a circumferential surface of the ring-shaped winding portion, and
wherein the ring-shaped winding portion is formed at a position that does not overlap a metal portion of the speaker.

2. The headset of claim 1, comprising a shielding sheet disposed on one surface of the wireless power receiving antenna so that a magnetic field generated from the wireless power receiving antenna is shielded to be collected in a predetermined direction.

3. The headset of claim 1, wherein the battery module embedded in the connecting unit is a flexible battery.

4. The headset of claim 3, wherein:
the flexible battery includes an exterior material and an electrode assembly;
the exterior material and the electrode assembly include a pattern for contraction and relaxation in a longitudinal direction; and
the pattern formed in the exterior material and the pattern formed in the electrode assembly are formed to coincide with each other.

5. A headset charging system using wireless power transfer, comprising:
the headset capable of wireless charging disclosed in claim 1; and a charging device including a wireless power transmitting antenna configured to provide wireless power to the headset to charge the battery module when the headset is held.

6. The headset charging system of claim 5, wherein the charging device includes a holding member on which the headset is held, and a wireless power transmitting antenna embedded in the holding member to be located at a position corresponding to the wireless power receiving antenna.

7. The headset charging system of claim 6, comprising a shielding sheet disposed on one surface of the wireless power transmitting antenna so that a magnetic field generated from the wireless power transmitting antenna is shielded to be collected in a predetermined direction.

8. A headset charging system using wireless power transfer, comprising:
a headset capable of wireless charging; and
a charging device including a wireless power transmitting antenna configured to provide wireless power to the headset to charge a battery module when the headset is held,
wherein the headset includes a pair of body units each including a housing equipped with a speaker and a cushion unit, a connecting unit configured to connect the pair of body units, the battery module embedded in at least one of the body units and the connecting unit to provide driving power, and a wireless power receiving antenna configured to receive wireless power transmitted from the wireless power transmitting antenna to supply power for charging the battery module,
wherein the charging device includes a holding member on which the headset is held, and the wireless power transmitting antenna embedded in the holding member located at a position corresponding to the wireless power receiving antenna, and
wherein:
the holding member includes a base part and an accommodation part configured to protrude in both directions from the base part and having one end portion inserted into and disposed in a center portion of the cushion unit when the headset is held; and
the wireless power transmitting antenna is embedded in an end portion of the accommodation part.

9. A headset charging system using wireless power transfer, comprising:
a headset capable of wireless charging; and
a charging device including a wireless power transmitting antenna configured to provide wireless power to the headset to charge a battery module when the headset is held,
wherein the headset includes a pair of body units each including a housing equipped with a speaker and a cushion unit, a connecting unit configured to connect the pair of body units, the battery module embedded in at least one of the body units and the connecting unit to provide driving power, and a wireless power receiving antenna configured to receive wireless power transmitted from the wireless power transmitting antenna to supply power for charging the battery module,
wherein the charging device includes a holding member on which the headset is held, and the wireless power transmitting antenna embedded in the holding member located at a position corresponding to the wireless power receiving antenna and,
wherein:
the holding member includes a base part, and a protruding part configured to protrude in both directions from the base part and in which a seating groove, into which the body unit is inserted when the headset is held, is formed; and
the wireless power transmitting antenna is embedded in the protruding part.

* * * * *